(12) United States Patent
Hirai

(10) Patent No.: US 7,326,585 B2
(45) Date of Patent: Feb. 5, 2008

(54) FORMING PROCESS OF THIN FILM PATTERN AND MANUFACTURING PROCESS OF DEVICE, ELECTRO-OPTICAL APPARATUS AND ELECTRONIC APPARATUS

(75) Inventor: Toshimitsu Hirai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 246 days.

(21) Appl. No.: 10/843,426

(22) Filed: May 12, 2004

(65) Prior Publication Data

US 2005/0003645 A1      Jan. 6, 2005

(30) Foreign Application Priority Data

May 27, 2003   (JP) ............... 2003-149648

(51) Int. Cl.
*H01L 21/00*   (2006.01)
(52) U.S. Cl. .................. 438/30; 438/99; 438/149; 257/E21.1
(58) Field of Classification Search ........... 438/584, 438/30, 99, 149
See application file for complete search history.

(56) References Cited

U.S. PATENT DOCUMENTS

| 5,132,248 | A | 7/1992 | Drummond et al. | |
|---|---|---|---|---|
| 6,541,389 | B1 | 4/2003 | Kubo et al. | |
| 6,630,274 | B1 * | 10/2003 | Kiguchi et al. | 430/7 |
| 6,737,287 | B1 * | 5/2004 | Furuse et al. | 438/21 |
| 6,926,057 | B2 | 8/2005 | Ueyama et al. | |
| 2003/0059975 | A1 * | 3/2003 | Sirringhaus et al. | 438/99 |
| 2003/0059984 | A1 * | 3/2003 | Sirringhaus et al. | 438/141 |
| 2003/0059987 | A1 * | 3/2003 | Sirringhaus et al. | 438/149 |
| 2003/0060038 | A1 * | 3/2003 | Sirringhaus et al. | 438/637 |
| 2005/0071969 | A1 * | 4/2005 | Sirringhaus et al. | 29/4.51 |
| 2006/0035064 | A1 * | 2/2006 | Hirai | 428/195.1 |

FOREIGN PATENT DOCUMENTS

| JP | A-2000-353594 | 12/2000 |
|---|---|---|
| JP | A-2002-015866 | 1/2002 |
| JP | A-2003-077652 | 3/2003 |

\* cited by examiner

*Primary Examiner*—Thanh Nguyen
(74) *Attorney, Agent, or Firm*—Oliff & Berridge, PLC

(57) ABSTRACT

The invention provides a forming process of a thin film pattern capable of properly realizing a thin line. The forming process of a thin film pattern of the invention can be a process of forming a thin film pattern by arranging a functional liquid on a substrate P. The process can include a bank forming step to set up banks protrudingly on the substrate corresponding to the thin film pattern, a repellent liquefaction step of imparting a liquid repellent property to the bank by $CF_4$ plasma processing, and a material arranging step of arranging the functional liquid between the banks imparted with the liquid repellent property.

8 Claims, 11 Drawing Sheets

FORMING PROCESS OF THIN FILM PATTERN AND MANUFACTURING PROCESS OF DEVICE, ELECTRO-OPTICAL APPARATUS AND ELECTRONIC APPARATUS

BACKGROUND OF THE INVENTION

1. Field of Invention

This invention relates to a process of forming a thin film pattern and a manufacturing process of a device, an electro-optical apparatus, and an electronic apparatus.

2. Description of Related Art

In processing a device having an electronic circuit, an integrated circuit and the like, for example, photolithography can be employed. The photolithography can be made up of coating a photosensitive material called a photoresist on a substrate pretreated with a conductive film, irradiating it with a circuit pattern and developing it, applying photo-etching to the conductive film according to a photoresist pattern, thus producing a thin film wiring pattern. Large-scale equipment and complicated processes, such as vacuum equipment, are required for this photolithography, and further, since efficiency of using materials is of the order of a few percentage points, most of the materials are necessarily discarded. Manufacturing cost is thus high.

On the other hand, there are proposed a process of ejecting liquid droplets, in which a liquid material is spewed out in droplets from a droplet ejection head, and a forming process of a wiring pattern on the substrate by using a so-called ink-jet method (for example, refer to patent document 1). According to this process, a wiring pattern forming ink, which is a functional liquid with conductive particulates, such as metallic particulates dispersed therein, is directly applied in pattern to the substrate, followed by heat treatment and laser irradiation for conversion thereof to a thin-film conductive pattern. According to this process, photolithography is made unnecessary, thus greatly simplifying a process and bringing about an additional advantage of less consumption of raw materials. See, for example, U.S. Pat. No. 5,132,248.

SUMMARY OF THE INVENTION

Continuing efforts have been made to develop higher and higher density of circuits constituting devices, thereby calling for further thin lines regarding wiring patterns. However, in a case where forming a wiring pattern of a thin line width is attempted based on the process of ejecting liquid droplets, can be difficult to obtain sufficient precision of its wiring line width. It is also extremely difficult to cope with a case where a thinner line width than a diameter of an ejected liquid droplet is required.

An aspect of the invention has been made in view of such circumstances. It is an object thereof to provide a forming process of a thin film pattern and a manufacturing process of a device, an electro-chemical device, and electronic apparatus, which make it possible to produce proper thin lines in forming a thin film pattern, such as wiring on a substrate, according to the process of ejecting liquid droplets.

A forming process of a thin film pattern according to this invention can be a process of forming a thin film pattern by arranging a functional liquid on a substrate. The process can include forming a bank to form banks matching the thin-film pattern on the substrate, processing repellent liquefaction to impart a liquid repellent property to the banks; and arranging a material to place the functional liquid between the banks which are imparted with the liquid repellent property.

According to an aspect of invention, because of a construction of arranging the functional liquid for forming the thin film pattern between the banks which are protrudingly set up on the substrate, it is possible to carry out patterning of the thin film pattern smoothly along a shape of the banks to a desired line width. Also, even though part of the ejected functional liquid is deposited on the banks, since the banks are imparted with the liquid repellent property, that part is repelled from the banks and runs down to a bottom part between the banks. Consequently, the functional liquid ejected is properly placed between the banks on the substrate, thereby making it possible to realize a thin line of the thin film pattern formed.

In this case, the step of processing repellent liquefaction can include a plasma processing step using a fluorocarbon compound such as carbon tetrafluoride ($CF_4$) as a reaction gas. This permits a fluorine radical to be introduced to the banks, and the banks obtain the liquid repellent property not dependent upon a solvent of the functional liquid, whereas since the complete liquid repellent property is provided to the banks without subjecting composition of the functional liquid to optimization in the $CF_4$ plasma processing, it is possible to broaden a range of choice of the functional liquid for use.

It is preferable to make the liquid repellent property of the banks higher than the bottom part between the banks, whereby the functional liquid arranged between the banks properly wets and spreads at the bottom part, forming a uniform thin film pattern.

Further, according to the process of forming a thin film pattern of this invention, having a step of lyophilic processing to impart a lyophilic property to the bottom part between the banks enables the functional liquid to wet and spread at the bottom part in a further proper manner.

According to the process of forming a thin film pattern of the invention, the step of arranging a material can further include a step of ejecting liquid droplets to eject liquid droplets of the functional liquid to between the banks, and the banks comprise having a finer width than a diameter of the liquid droplet. By this, even if adjustment work of the diameter of the ejected liquid droplet is not performed strictly, part of the liquid droplet on the banks is properly arranged between the banks on the substrate due to fluidity of the functional liquid, capillary action and the like, so that a thin film pattern having a line width matching the banks may be formed. In other words, although making a small diameter of the liquid droplet to be ejected may sometimes take time such as adjustment work of a drive waveform of a liquid droplet ejection head and adjustment work of material properties of the functional liquid, by forming the banks matching a thin film pattern to be formed and imparting the liquid repellent property to the banks, it is possible to form properly a thin film pattern having a desired line width even without strictly carrying out the above-mentioned work.

Now, by making a weight of the liquid droplet, for example, more than 1 ng and less than 5 ng, when a width of a groove part between the banks is set, for example, at approximately 10 μm, it is possible to arrange the liquid droplet properly between the banks.

The forming process of a thin film pattern of this invention can include conductive particulates in the functional liquid. Or the functional liquid features inclusion of a material which manifests conductivity upon heat treatment or optical treatment. According to this invention, a thin film pattern may be made into a wiring pattern which may be applicable to various devices. Further, by using forming materials of light-emitting elements, such as an organic EL, as well as ink materials of RGB in addition to conductive particulates and the like, applications thereof may be extended to manufacturing an organic EL device, an LCD having a color filter and the like.

Still further, in forming a thin film pattern making up part of a device having a pixel, by setting the width of the groove part between the banks more than 1/20 and less than 1/10 in a direction of a short side of the pixel, it is possible to form a desired line width of a wiring pattern making up a switching element such as a thin film transistor arranged according to this pixel. At this point, suppose a long side of one pixel formed in a rectangle is approx. 300 μm and a short side thereof is approx. 100 μm, the width of the groove part (the line width of the wiring pattern in its turn) is set at 5-10 μm.

In a manufacturing process of a device having a step of forming a thin film pattern on a substrate, the manufacturing process of a device according to this aspect of the invention consists of forming a thin film pattern on the substrate by means of the above-mentioned step of forming a thin film pattern. According to this invention, it is possible to obtain a device having a thin film pattern for which making a fine line has been realized.

An electro-optical apparatus of the invention can include a device manufactured by using the above-mentioned manufacturing process of a device. Further, the electro-optical apparatus of this invention comprises the above-mentioned electro-optical apparatus. According to this aspect of the invention, it is possible to obtain an electro-optical apparatus and an electronic apparatus having a wiring pattern for which making a fine line as well as a microstructure has been realized.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Figure 1:
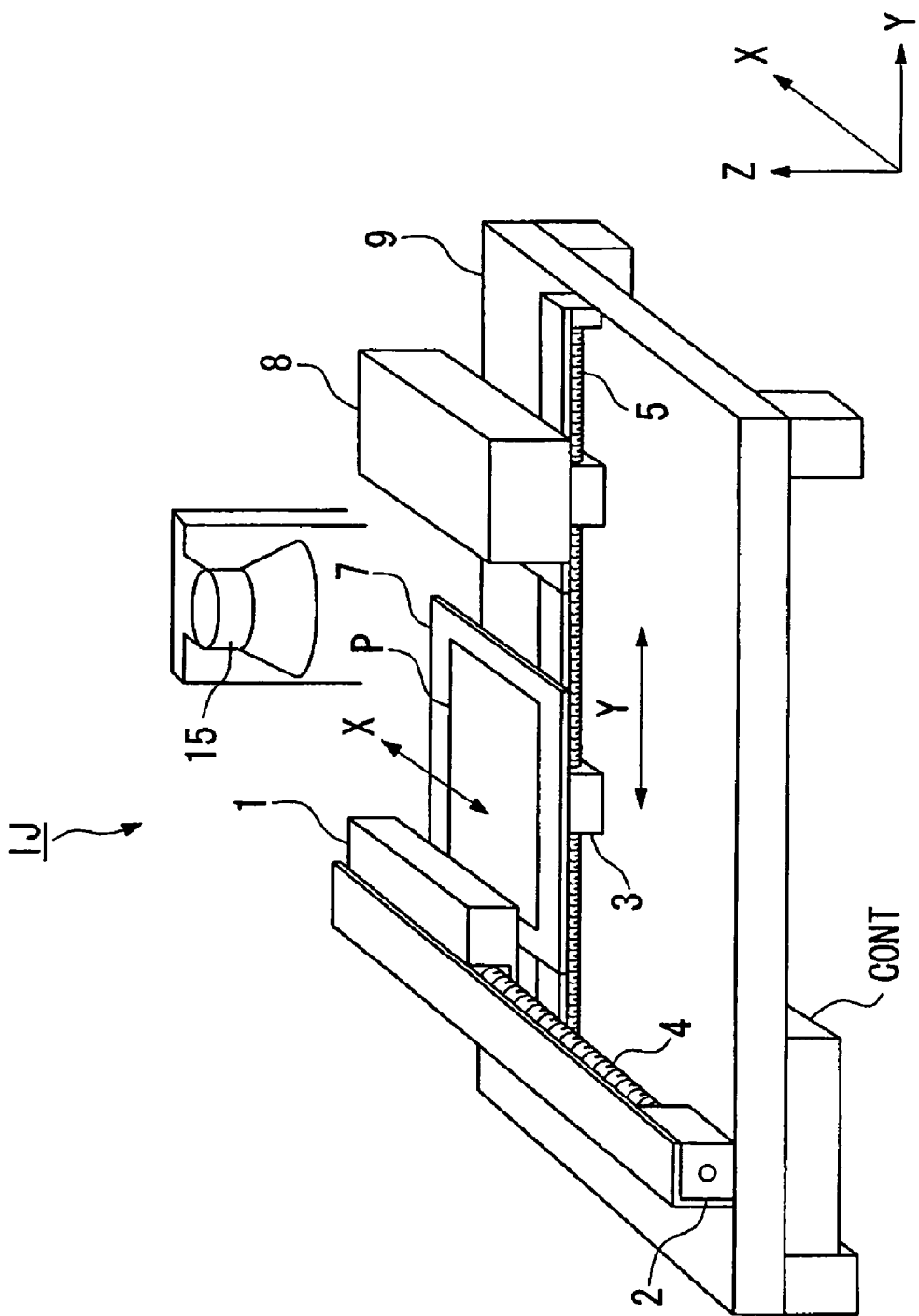
FIG. 1 is a schematic perspective view of a liquid droplet ejection unit.

An embodiment of a forming process of a thin film pattern and a manufacturing process of a device of this invention will be described below with reference to drawings. In this embodiment, description will be made by citing an example in which a wiring pattern formed of a conductive film on a substrate is formed as ink for forming (functional liquid) a wiring pattern (thin film pattern) is ejected in liquid droplets from ejection nozzles of an ejection head according to a liquid droplet ejection process.

First, the ink (functional liquid) to be used will be described. The wiring pattern forming ink which is a liquid material consists of a dispersed liquid in which conductive particulates have been dispersed in a dispersion medium. In this embodiment, as conductive particulates, in addition to metallic particulates containing at least one of gold, silver, copper, aluminum, palladium, and nickel, there are employed these oxides as well as particulates of conductive polymers and super conductive matter. To improve dispersibility of these conductive particulates, an organic matter may be coated on their surfaces for use. It is preferable for a particle diameter of a conductive particulate to be more than 1 nm and less than 0.1 μm. If it is more than 0.1 μm, there is a risk that the ejection nozzles of the liquid droplet ejection head may be clogged. Further, if it is less than 1 nm, a volume ratio of a coating agent to a conductive particulate becomes large, so that the ratio of an organic matter in a film obtained becomes excessive.

As the dispersion medium, so long as such substance is capable of dispersing the above-mentioned conductive particulates without causing aggregation, there is no specific restriction. For example, in addition to water, there may be illustrated alcohols, such as methanol, ethanol, propanol, and butanol; hydrocarbon compounds, such as n-heptane, n-octane, decane, dodecane, tetradecane, toluene, xylene, cymene, durene, indene, dipenten, tetrahydronaphthalene, decahydronaphthalene, and cyclohexylbenzene; ether compounds, such as ethyleneglycoldimethylether, ethyleneglycoldimethylethylether, ethyleneglycolmethylethylether, diethyleneglycoldimethylether, diethyleneglycoldiethylether, diethyleneglycolmethylethylether, 1,2-dimethoxyethane, bis(2-methoxyethyl) ether, and p-dioxane; and polar compounds such as propylenecarbonate, γ-butyrolactone, N-methyl-2-pyrroridone, dimethylformamide, dimethylsulfoxyde, and cyclohexanone. Of these substances, water, alcohols, hydrocarbons, and ether compounds are preferable in terms of dispersibility of particulates and stability of a dispersed liquid as well as ease of application to the liquid droplet ejection process. For more preferable dispersion media, water and hydrocarbons may be cited.

It is preferable that surface tension of the above-mentioned dispersed liquid of conductive particulates is within a range of more than 0.02 N/m and less than 0.07 N/m. When ejecting the ink by technique of the liquid droplet ejection process, if the surface tension is short of 0.02 N/m, wettability of the ink to a nozzle surface increases such that a flying curve tends to occur, and if it exceeds 0.07 N/m, a shape of a meniscus at a nozzle tip does not remain stable, so that control of an ejection volume and ejection timing become difficult.

To adjust the surface tension, it may do well to add a surface tension adjusting agent of a fluorine type, a silicone type, a nonion type and the like to the above-mentioned dispersed liquid. The surface tension adjusting agent of the nonion type is conducive to enhancing the wettability of the ink to the substrate, improving a leveling property of the film, and preventing occurrences of minute unevenness of the film. The above-mentioned surface tension adjusting agent may contain, as necessary, an organic compound such as alcohol, ether, ester, and ketone.

It is preferable that viscosity of the above-mentioned dispersed liquid is more than 1 mPa·s and less than 50 mPa·s. When ejecting the ink as a liquid droplet by technique of the liquid droplet ejection process, if the viscosity is less than 1 mPa·s, a periphery of the nozzle tends to be soiled by an ink flow, and if the viscosity exceeds 50 mPa·s, a nozzle hole gets clogged with a higher frequency, so that smooth ejection of liquid droplets becomes difficult.

As a substrate on which the wiring pattern is formed, various materials, such as glass, quartz glass, silicone wafer, plastic film, and metallic plate may be used. Further, the substrate includes any of those substrates of these various materials, on the surface of which is formed an undercoat layer of a semiconductor film, a metallic film, a film of a conductive matter, an organic film and the like.

Now, as ejection techniques of the liquid droplet ejection process, there may be mentioned systems, such as a charging control system, a high-tension vibration system, an electro-mechanical conversion system, an electric heat conversion system, and an electrostatic suction system. The charging control system provides a charge to a material by technique of a charging electrode, controlling a flight direction of the material by a polarizing electrode, and ejecting the material from the ejection nozzles. Also, the high-tension vibration system impresses an ultra high-tension of approximately 30 $kg/cm^2$ upon the material to make the material ejected from the ejection nozzle, whereby if a control voltage is not impressed, the material moves straight to be ejected from the ejection nozzles, and if the control voltage is impressed, an electrostatic repulsion occurs between materials, so that the material flies around and is not ejected from the ejection nozzles. Further, the electromechanical conversion system utilizes a property of a piezoelectric element which distorts upon receipt of pulse electric signals. As distortion occurs in the piezoelectric element, a pressure is applied through a pliable material to a space in which the material is stored, and the material is pushed out from this space to be ejected from the ejection nozzles.

Still further, the electric heat conversion system is a method using a heater set up in a space storing a material to vaporize the material rapidly so that bubbles are generated, whereby pressure of the bubbles causes the material in the space to be ejected. The electrostatic suction system applies minute pressure to inside the space where the material is stored, forming a meniscus of the material in the ejection nozzles, whereas electrostatic attraction is applied in this state, then, the material is pulled out. Also, in addition, there are applicable techniques, such as a system of utilizing viscosity change of a fluid in an electric field and a system of blowing with discharge sparks. The liquid droplet ejection process leaves little waste in consuming the material with an added advantage of arranging a desired quantity of the material precisely to a desired position. It is to be noted that the quantity of the liquid material to be ejected by the liquid droplet ejection process is, for example, 1-300 nanograms.

Next, a device manufacturing apparatus to be used when manufacturing a device according to this invention will be described. As the device manufacturing apparatus, there is employed a liquid droplet ejection unit (inkjet unit) which manufactures a device by ejecting (dropping) a liquid droplet from the liquid droplet ejection head to the substrate.

FIG. 1 is a perspective view of a schematic diagram of a liquid droplet ejection unit IJ. In FIG. 1, the liquid droplet ejection unit IJ is made up of a liquid droplet ejection head I, an x-axis direction drive shaft 4, a y-axis direction guide shaft 5, a control unit CONT, a stage 7, a cleaning unit 8, a bed plate 9, and a heater 15.

The stage 7 is that which supports a substrate P on which ink is arranged by this liquid droplet ejection unit IJ, having of an un-illustrated fixing structure which affixes the substrate P to a reference position.

The liquid droplet ejection head 1 is the liquid droplet ejection head of a multi-nozzle type provided with a plurality of ejection nozzles, its longitudinal direction in agreement with its x-axis direction. The plurality of the ejection nozzles are set up at a fixed interval on an underside of the liquid droplet ejection head 1 in line with the x-axis direction. From the ejection nozzles of the liquid droplet ejection head 1, there is ejected ink containing the above-mentioned conductive particulates to the substrate P.

To the x-axis direction drive shaft 4, there is connected an x-axis direction drive motor 2. The x-axis direction drive motor 2 is a stepping motor and the like, revolving the x-axis direction drive shaft 4 when a drive signal in the x-axis direction is supplied from the control unit CONT. When the x-axis direction drive shaft 4 turns around, the liquid droplet ejection head 1 moves towards the x-axis direction.

The y-axis direction guide shaft 5 is affixed so as not to move relative to the bed plate 9. The stage 7 is equipped with a y-axis direction drive motor 3. The y-axis direction drive motor 3 is a stepping motor and the like, moving the stage 7 in the y-axis direction, when a drive signal in the y-axis direction is supplied from the control unit CONT.

The control unit CONT supplies voltage for ejection control of liquid droplets to the liquid droplet ejection head 1. Further, the control unit CONT supplies to the x-axis direction drive motor 2 a drive pulse signal controlling movement of the liquid droplet ejection head 1 in the x-axis direction, while, at the same time, supplying to the y-axis direction drive motor 3 a drive pulse signal controlling movement of the stage 7 in the y-axis direction.

The cleaning unit 8 is that which cleans up the liquid droplet ejection head 1 with provision of the un-illustrated, y-axis direction drive motor. By a drive of this y-axis direction drive motor, the cleaning unit 8 moves along the y-axis direction guide shaft 5. Movement of the cleaning unit 8, too, is controlled by the control unit CONT.

In this instance, the heater 15 can conduct heat treatment of the substrate P by lamp annealing, carrying out evaporation and drying of a solvent contained in the ink coated on the substrate P. Making and breaking a power supply of this heater 15 is also controlled by the control unit CONT.

The liquid droplet ejection unit IJ ejects liquid droplets to the substrate P while scanning relatively the liquid droplet ejection head 1 and the stage 7 supporting the substrate P. At this point, in the description provided below, the y-axis direction is treated as a scanning direction and the x-axis direction perpendicular to the y-axis direction is treated as a non-scanning direction. Hence, the ejection nozzles of the liquid droplet ejection head 1 are set up in a row along the x-axis direction, which is the non-scanning direction, at a fixed interval. It is to be noted that although the liquid droplet ejection head 1 is placed at a right angle to an advancing direction of the substrate P in FIG. 1, an angle of the liquid droplet ejection head 1 may be adjusted so that it may intersect the advancing direction of the substrate P. In this manner, it is possible to adjust a pitch between the nozzles by adjusting the angle of the liquid droplet ejection head 1.

Further, a distance between the substrate P and a nozzle surface may be set as freely adjustable.

Figure 2:
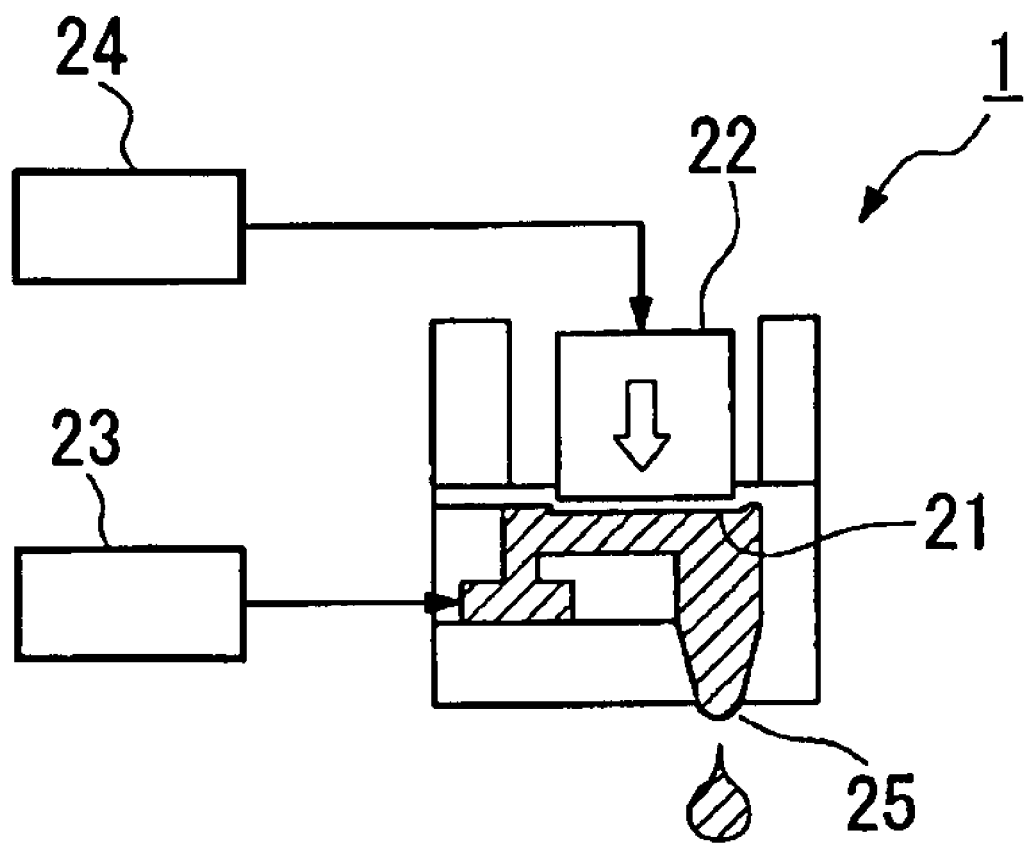
FIG. 2 is a diagram explaining an ejection principle of a liquid material by means of a piezoelectric system.

FIG. 2 is a diagram to explain an ejection principle of a liquid material according to the piezoelectric system. In FIG. 2, adjacent to a liquid chamber 21 accommodating the liquid material (ink for forming wiring patterns and functional liquid), there is provided a piezoelectric element 22. In the liquid chamber 21, there is supplied the liquid material through a liquid material supply system 23 including a material tank which accommodates the liquid material. The piezoelectric element 22 is connected to a drive circuit 22, through which voltage is impressed upon the piezoelectric element to distort the piezoelectric element 22, thus resulting in distorting the liquid chamber 21 and causing the liquid material to be ejected from the ejection nozzles 25. In this case, by varying a frequency of an impressed voltage, a quantity of the distortion of the piezoelectric element 22 is controlled. In addition, by varying the frequency of the impressed voltage, a distortion rate of the piezoelectric element 22 is controlled. Since liquid droplet ejection according to the piezoelectric system gives no heat to the material, it offers an advantage of hardly affecting composition of the material.

Figure 3:
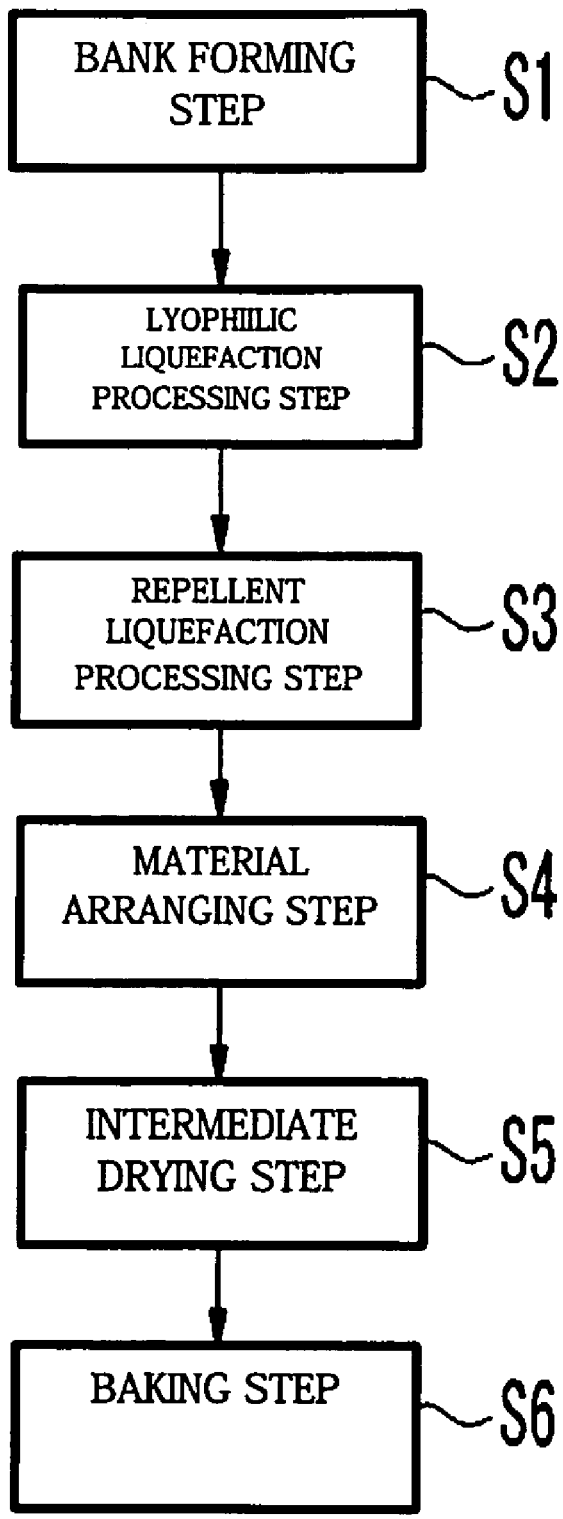
FIG. 3 is a flowchart showing an embodiment of a forming process of a thin film pattern of this invention.
Figure 4A:
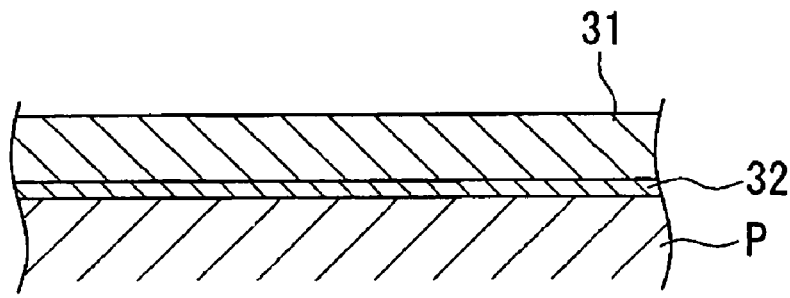
FIG. 4 is a schematic diagram of an example of procedures to form a thin film pattern of this invention.
Figure 4B:
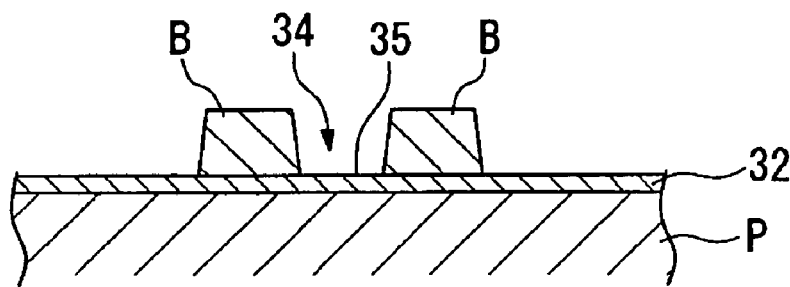
Figure 4C:
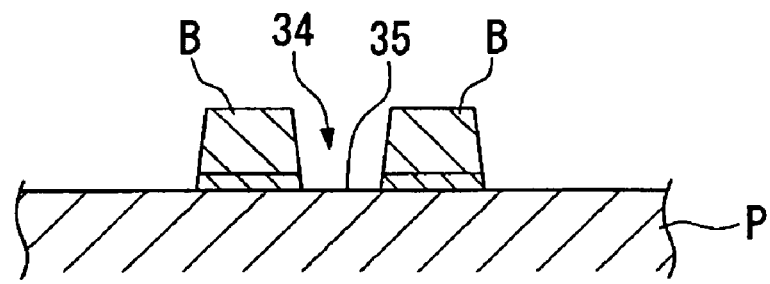
Figure 5D:
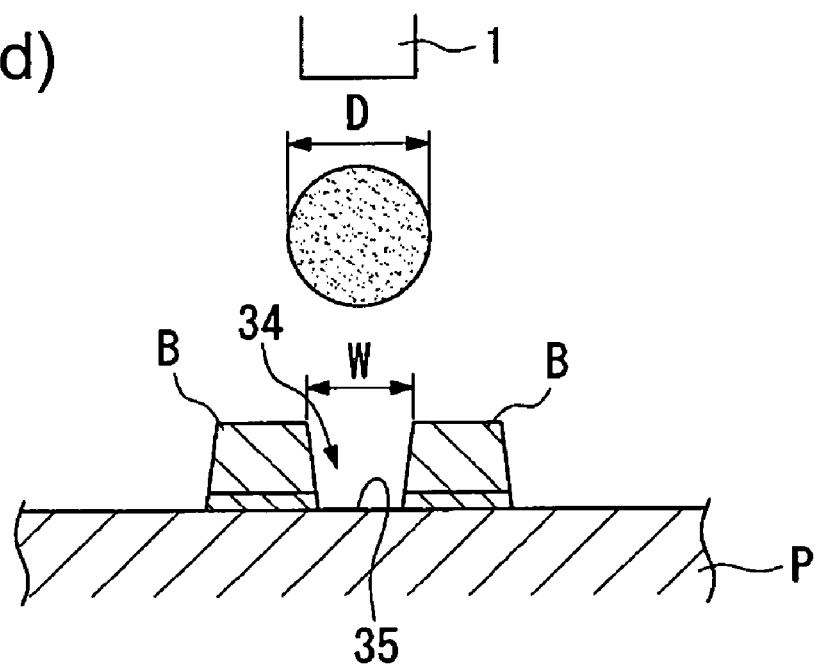
FIG. 5 is a schematic diagram of an example of procedures to form a thin film pattern of this invention.
Figure 5E:
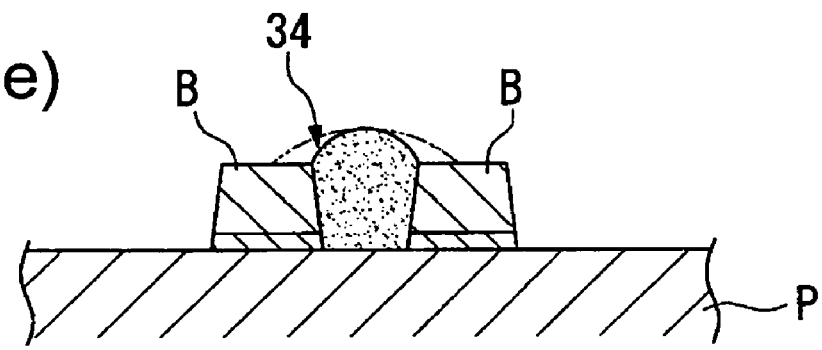
Figure 5F:
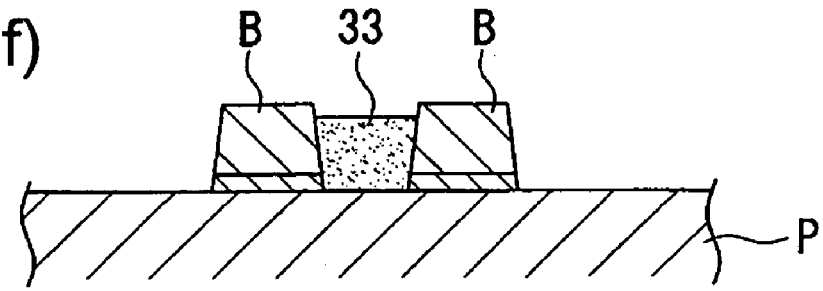

Next, an embodiment of a forming process of a wiring pattern of this invention will be described with reference to FIG. 3, FIG. 4, and FIG. 5. FIG. 3 is a flowchart showing an exemplary forming process of a wiring pattern according to this embodiment, and FIG. 4 and FIG. 5 are schematic diagrams showing exemplary forming procedures.

As FIG. 3 shows, the forming process of the wiring pattern is made up of placing the above-mentioned wiring pattern forming ink on the substrate and forming a conductive film wiring pattern, including a bank forming step S1 to set up banks matching a wiring pattern protrudingly on the substrate, a step S2 of processing lyophilic liquefaction to impart a lyophilic property to the substrate, a step S3 of processing repellent liquefaction to impart a liquid repellent property to the banks, a material arranging step S4 of arranging ink between the banks imparted with the liquid repellent property, an intermediate drying step S5 of at least partially removing a liquid ingredient of the ink and a baking step S6.

Detailed description will be given below for each step. In this embodiment, a glass substrate is used for the substrate P.

Bank Forming Step

First, prior to coating an organic material, for surface improvement treatment, an HMDS processing is performed to the substrate P. The HMDS processing is a method of vaporizing hexamethyldisilazane (($CH_3$)$_3$SiNHSi($CH_3$)$_3$) into a state of steam for coating. By this means, as shown in FIG. 4(a), an HMDS layer 32 is formed on the substrate P as a closely adhered layer to improve adhesion between the banks and the substrate P.

A bank is a member functioning as a partitioning member, and formation thereof may be performed by any arbitrary method, such as photolithography and printing. For example, when using photolithography, an organic photosensitive material 31 is coated according to a height of the bank on the HMDS layer 32 of the substrate P by a prescribed method, such as spin coat, spray coat, roll coat, dye coat, and dip coat, then a photoresist layer is coated thereon.

Subsequently, a mask is provided to fit a bank shape (wiring pattern), and by subjecting the photoresist to exposure and development, the photoresist fitting the bank shape remains. Also, a bank (convex) may be formed with more than two layers having a bottom layer of an inorganic matter and a top layer of an organic matter. By this technique, as shown in FIG. 4(b), banks B and B are protrudingly set up in a manner surrounding the periphery of an area planned for wiring pattern formation. Now, it is desirable for the banks B and B formed in this way to be tapered from a narrow width of a top side to a broad width of a bottom side, so that ink droplets may easily run into the groove part between the banks, as explained in greater detail below.

An organic material forming the bank may be a material having a liquid repellent property to ink, or, as explained below, it may be an insulating organic material capable of being made liquid repellent (fluorination) by plasma processing, having good adhesion to an under coat substrate as well as ease of patterning by photolithography. For example, it is possible to use a high-molecule material such as an acrylic resin, a polyimide resin, an olefin resin, a phenol resin, and a melamine resin. Or a material having an organic radical with an inorganic skeleton (siloxane bond) as its main chain is acceptable.

When the banks B and B are formed on the substrate P, hydrofluoric acid processing is performed. The hydrofluoric acid processing is, for example, a processing to remove the HMDS layer 32 between the banks B and B by etching with a 2.5% hydrofluoric acid water solution. In the hydrofluoric acid processing, the banks B and B function as a mask, and as shown in FIG. 4(c), the HMDS layer 32, an organic matter, which is formed between the banks B and B, on the bottom part 35 of the groove part 34 is removed to expose the substrate P.

Lyophilic LiguefactionProcessing Step

Next, there is performed a step of lyophilic liquefaction processing to impart a lyophilic property to the bottom part 35 (an exposed part of the substrate P) between the banks B and B. For the step of lyophilic liquefaction processing, there may be selected an ultraviolet (UV) irradiation processing for irradiation with ultraviolet light, an $O_2$ plasma processing using oxygen as a processing gas in atmosphere and the like. The $O_2$ plasma processing is carried out in this case.

The $O_2$ plasma processing irradiates the substrate P with oxygen in plasma state from a plasma discharge electrode. As an example of $O_2$ plasma processing conditions, consider a plasma power of 50-1000 W, an oxygen gas flow rate of 50-100 mL/min, a relative movement rate of a substrate 1 pertaining to a plasma discharge electrode of 0.5-10 mm/sec, and a substrate temperature of 70-90° C.

And, in a case where the substrate P is a glass substrate, its surface is lyophilic with respect to the wiring pattern forming ink, whereas, by performing the $O_2$ plasma processing and the ultraviolet irradiation processing as in this embodiment, it is possible to further increase the lyophilic property of a surface of the substrate P (bottom part 35) exposed between the banks B and B. At this point, it is preferable that the $O_2$ plasma processing or the ultraviolet irradiation processing is carried out such that an angle of contact with the ink of the bottom part between the banks may be under 15 degrees.

Figure 6:
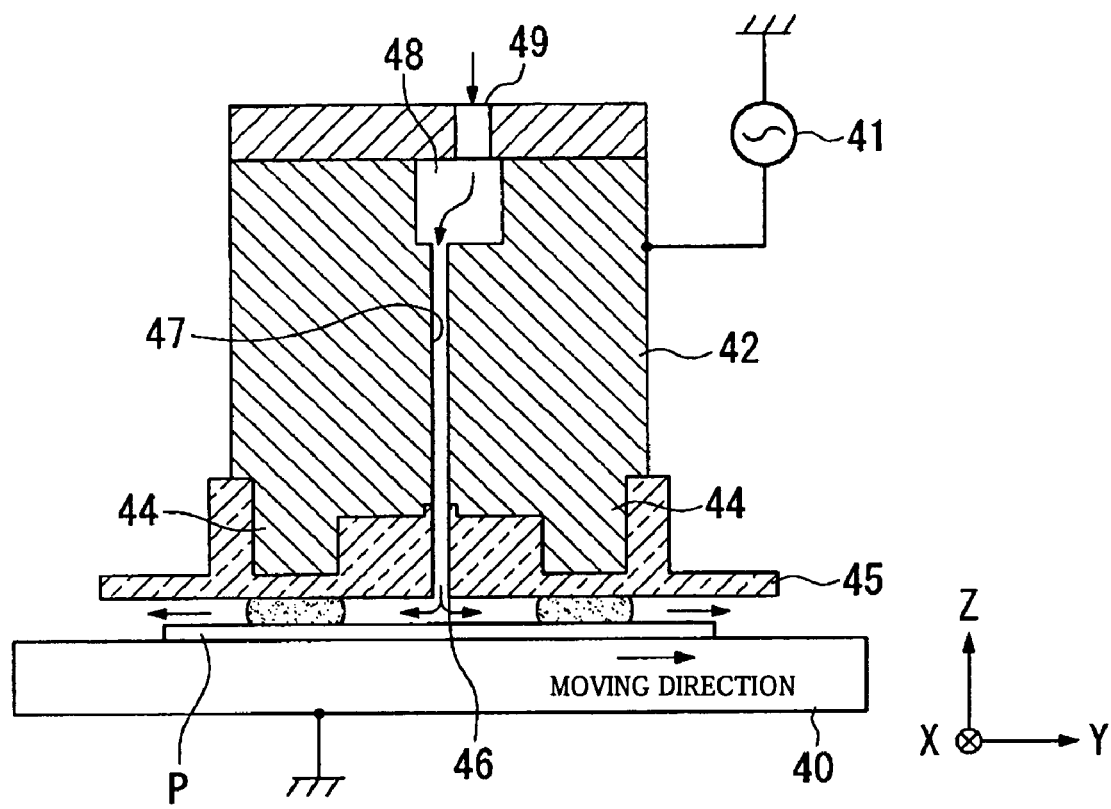
FIG. 6 is a diagram showing an example of a plasma processing apparatus to be used in a residue disposal step.

FIG. 6 is a schematic diagram showing an example of a plasma processing apparatus used for the $O_2$ plasma processing. The plasma processing apparatus shown in FIG. 6 has an electrode 42 connected to an AC power supply 41 and a sample table 40 which is a grounding electrode. The sample table 40 is movable in the y-axis direction while supporting the substrate P which is a sample. On the underside of the electrode 42, there are protrudingly set up two parallel discharge generating parts 44 and 44 extending in the x-axis direction which perpendicularly intersect the moving direction, whereas a dielectric member 45 is provided in a manner of surrounding the discharge generating parts 44. The dielectric member 45 prevents abnormal discharge of the discharge generating parts 44, and the underside of the electrode 42 including the dielectric member 45 is somewhat planar, so that a slight space (discharge gap) is formed between the discharge generating parts 44 and the dielctric member 45, and the substrate P. Further, in a center of the electrode 42, there is provided a gas jet port 46 constituting part of a process gas supply part which is formed long and narrow in the x-axis direction. The gas jet port 46 is connected to a gas entry mouth 49 through a gas passage 47 inside the electrode and an intermediate chamber 48.

A prescribed gas including process gas jetted from the gas jet port 46 through the gas passage 47 divides into the front and back of the moving direction (y-axis direction) and flows in the space to be discharged from a front end and a rear end of the dielectric member 45 to the outside. Simultaneously, a prescribed voltage is impressed upon the electrode 42 from the power supply 41, and a gas discharge generates between the discharge generating parts 44 and 44 and the sample table 40. Then, by plasma generated by this gas discharge, an excitation activating seed of the prescribed gas is generated, thereby consecutively processing an entire surface of the substrate P passing a discharge area.

In this embodiment, the prescribed gas is a mixture of oxygen ($O_2$) which is the process gas, a rare gas, such as helium (He) and argon (Ar) for starting discharge easily and maintaining it stably under a pressure in the vicinity of atmospheric pressure and an inert gas such as nitrogen ($N_2$). In particular, use of oxygen as the process gas makes it possible to remove organic residues (photoresist and HMDS) at the bottom part 35 between the banks B and B at the time of formation of the banks. Namely, there may be a case where in the hydrofluoric acid processing, the HMDS (organic matter) at the bottom part 35 between the banks B and B may not be completely removed. Or, there is a case where the photoresist (organic matter) at the bottom part 35 between the banks B and B at the time of formation of the banks is still remaining. Therefore, by performing the $O_2$ plasma processing, the residues at the bottom part 35 between the banks B and B are removed.

Furthermore, by performing this $O_2$ plasma processing, for example, to an electrode of an organic EL device, it is possible to adjust a work function of this electrode.

It is to be noted that the hydrofluoric acid processing has been described to be performed to remove the HMDS layer 32. However, since the $O_2$ plasma processing or the ultraviolet irradiation processing is able to remove the HMDS layer 32 at the bottom part 35 between the banks B and B, there is no need to carry out the hydrofluoric acid processing. Further, it has been described in this context that for lyophilic liquefaction processing, either the $O_2$ plasma processing or the ultraviolet irradiation processing is carried out. Naturally, a combination of the $O_2$ plasma processing and the ultraviolet irradiation processing may be carried out.

Repellent Liquefaction Processing Step

Next, the repellent liquefaction processing is performed on the banks B to provide the liquid repellent property to their surfaces. For the repellent liquefaction processing, a plasma processing ($CF_4$ plasma processing) using tetrafluoromethan is employed. Conditions of the $CF_4$ plasma processing are, for example, a plasma power of 50-1000 W, a tetrafluoromethane flow rate of 50-100 mL/min, a substrate conveying rate of 0.5-1020 mm/sec, and a substrate temperature of 70-90° C. It is to be noted that the process gas is not limited to tetrafluoromethane, but any other gas of the fluorocarbon type may be used. For $CF_4$ plasma processing, the plasma processing apparatus described by referring to FIG. 6 may be used.

By performing repellent liquefaction processing in this manner, a fluorine radical is introduced to a resin constituting the banks B and B, imparting a high liquid repellent property to the banks B and B. Now, the $O_2$ plasma processing as the lyophilic liquefaction processing described above may be performed prior to the formation of the banks B. Nevertheless, because preprocessing by $O_2$ plasma of the acrylic resin, the polyimide resin and the like contributes to making the resin easier to provide fluorination (repellent liquefaction), it is preferable to carry out the $O_2$ plasma processing after forming the bank B.

As a result of the repellent liquefaction processing relative to the banks B and B, the exposed section of the substrate P between the banks subjected to lyophilic liquefaction processing in advance may be somewhat affected. Nonetheless, if the substrate P is made up of glass and the like, introduction of the fluorine radical due to the repellent liquefaction processing does not occur, so that the substrate P may not virtually lose its lyophilic property or wettability.

Because of the above-mentioned lyophilic liquefaction processing step and repellent liquefaction processing step, surface improvement processing has been made such that the liquid repellent property of the banks B is higher than the liquid repellent property of the bottom part 35 between therebetween. It is to be noted that the $O_2$ plasma processing is carried out as lyophilic liquefaction processing, whereas, if the substrate P is made up of glass and the like, as mentioned above, introduction of the fluorine radical through the repellent liquefaction processing does not occur, so that even by carrying out only the $CF_4$ plasma processing without performing the $O_2$ plasma processing, the liquid repellent property of the banks B may be made higher than the bottom part 35 therebetween.

Material Arranging Step

Next, by using the liquid droplet ejection process based on the liquid droplet ejection unit IJ, a liquid droplet of the wiring pattern forming ink is arranged between the banks B and B on the substrate P. It is to be noted that at this point, an organosilver compound is used as a conductive material, and, as a solvent (dispersion medium), ink composed of an organosilver compound using diethyleneglycoldiethylether is ejected. In the material arranging step, as shown in FIG. 5(*d*), from the liquid droplet ejection head 1, the ink containing the wiring pattern forming material is made into the liquid droplets and ejected. The liquid droplet ejection head 1 ejects the ink droplets towards the groove part 34 therebetween and arranges the ink inside the groove part 34. At this time, since the area planned for wiring pattern formation (that is, the groove part 34) to which the liquid droplets are to be ejected is surrounded by the banks B and B, it is possible for the liquid droplets to spread to outside the prescribed position.

In this embodiment, a width W (at this point, a width of an opening of the groove part 34) of the groove part 34 between the banks B and B is set smaller than the diameter D of the liquid droplet of the ink (functional liquid). It is preferable that the atmosphere in which the droplets are ejected is at a temperature less than 60° C. and a humidity of less than 80%. This allows the ejection nozzles of the liquid droplet ejection head 1 to eject the liquid droplets without clogging and with stability.

As such, liquid droplet is ejected from the liquid droplet ejection head 1 and arranged inside the groove part 34, since the diameter D of the droplet is larger than the width W of the groove part 34, part of it rides on the banks B and B as shown in two-point chain line in FIG. 5(*e*). However, the surface of the banks B and B are liquid repellent in a tapered shape, so that a liquid droplet portion on the banks B and B is repelled from the banks B and B, and further, due to capillary action, flows into the groove part 34, whereby the liquid droplet enters into the groove part 34 as shown in 2-point chain lines in FIG. 5(*e*).

Further, the ink, which is ejected inside the groove part 34 or runs down from the banks B and B, tends to wet and spread because the substrate P (the bottom part 45) has been processed for lyophilic liquefaction, thus making the ink to fill inside the groove part 34 more uniformly. Consequently, despite the width W of the groove part 34 smaller than the diameter D of the liquid droplet, the liquid droplets ejected into the groove part 34 properly enter inside the groove part 34 to fill it uniformly.

Intermediate Drying Step

After the liquid droplet is ejected to the substrate P, to remove the dispersed medium and to secure film thickness, drying processing is carried out as necessary. The drying processing, for example, in addition to typical processing such as by a hotplate or an electric furnace to heat up the substrate P, may be subjected to lamp annealing. As a light source used for lamp annealing, though not specifically limited, there may be used an infrared lamp, a xenon lamp, a YAG laser, an argon laser, a carbonic acid gas laser, and an excimer laser, such as XeF, XeCl, XeBr, KrF, KrCl, ArF, and ArCl. For these light sources, those having a range of output from 10 W to 5000 W are typically used. In this embodiment, a range of output from 100 W to 1000 W is sufficient. And, by repeatedly carrying out the intermediate drying step as well as the above-mentioned material arranging step, a plurality of layers of liquid droplets of the ink are layered over, thus forming a wiring pattern (thin film pattern) 33 of a heavy film thickness.

Baking Step

In the case of the organosilver compound, it is necessary for a dry film after the ejection step to undergo heat treatment to obtain conductivity and remove an organic portion of the organosilver compound, so that silver particles remain. For this purpose, heat treatment and/or optical processing is applied to a substrate after the ejection step.

Although the heat treatment and/or optical processing is typically carried out in the atmosphere, as necessary, it may be carried out in an inert atmosphere, such as nitrogen, argon, and helium. Processing temperature of heat treatment and/or optical processing is determined by taking into consideration a boiling point of the dispersed medium (steam pressure), type and pressure of an atmosphere gas, dispersibility of particulates and thermal behavior such as oxidizability, existence and quantity of a coating material, heat-resistant temperature of a substrate member, and the like. In this embodiment, a baking step is carried out with respect to the ink of the groove part 34 in a clean oven in atmosphere from 150° C.-200° C. for 10-20 minutes. Further, for example, to remove the organic portion of the organosilver compound, it is necessary to bake at approximately 200° C. Furthermore, when a substrate member, such as plastics is used, it is preferable that baking is carried out at more than room temperature and less than 100° C. By means of the above-mentioned step, a dry film after the ejection step secures electric contact among the particulates and is converted to a conductive film.

Now, after the baking step, it is possible to remove the banks B and B existing on the substrate P by an ashing exfoliation processing. For the ashing processing, there may be employed plasma ashing, ozone ashing and the like. By causing a gas, such as an oxygen gas in a plasma state to react with the banks (photoresist), plasma ashing vaporizes, peels off and removes the banks. The bank is a solid material made of carbon, oxygen, and hydrogen, and as it enters into chemical reaction with oxygen plasma, it becomes $CO_2$, $H_2O$, and $O_2$, SO that it may be all peeled off as gas. On the other hand, the basic principle of ozone ashing is the same as plasma ashing in that $O_3$ (ozone) is dissolved and converted to a reactive gas $O^+$ (oxygen radical), causing this $O_+$ to react with the bank. The bank which has reacted with $O^+$ becomes $CO_2$, $H_2O$, and $O_2$ which are all exfoliated as gas. By subjecting the substrate P to the ashing exfoliation processing, the bank may be removed therefrom.

As described above, even though part of the liquid droplet of the ejected ink rides on the banks B, since the banks B are imparted with the liquid repellent property by the $CF_4$ plasma processing, that part is repelled from the banks B, thus running down to the bottom part 35 between the banks B and B, whereby the ejected ink is properly arranged on the substrate P therebetween, so that making a wiring pattern to be formed in thin lines may be properly realized.

It is to be noted that in this embodiment, the width W of the groove part 34 due to the banks B and B is made less than the diameter D of the liquid droplet. However, this invention is not limited thereby. Naturally, the width W of the groove part 34 may be made larger than the diameter D of the liquid droplet, and in this case, too, it is possible to form a pattern in precise agreement with a line width set by the groove part 34 between the banks.

Working Example $CF_4$ plasma processing was carried out to a glass substrate on which are formed banks of an olefin resin using the above-mentioned plasma processing apparatus under processing conditions of a plasma power of 550 W, a carbon tetrafluoride gas flow rate of 100 [mL/min], a He gas flow rate of 10 [L/min], and a moving rate of 2 mm/sec of the above-mentioned sample table 40. A contact angle of an organosilver compound (diethyleneglycol-dimethylether solvent) with respect to the banks after the $CF_4$ plasma processing was measured and it was 66.2 degrees. On the other hand, a contact angle of an organosilver compound (diethyleneglycoldimethylether solvent) with respect to the banks not subjected to the $CF_4$ plasma processing was measured and it was less than 10 degrees. This made it possible to verify that the banks were imparted with the liquid repellent property by the $CF_4$ plasma processing.

Likewise, the $CF_4$ plasma processing was carried out to a glass substrate on which are formed the banks of the olefin resin using the above-mentioned plasma processing apparatus under processing conditions of a plasma power of 550 W, a carbon tetrafluoride gas flow rate of 100 [mL/min], a He gas flow rate of 10 [L/min], and a moving rate of 2 mm/sec of the above-mentioned sample table 40. A contact angle of pure water with respect to the banks after the $CF_4$ plasma processing was measured and it was 104.1 degrees. On the other hand, a contact angle of pure water with respect to the banks not subjected to the $CF_4$ plasma processing was measured and it was 69.3 degrees. This made it possible to verify that even if pure water was used as a functional liquid, the banks were imparted with the liquid repellent property with respect to pure water by the $CF_4$ plasma processing.

Next, a liquid droplet of a liquid droplet weight of 4 ng was ejected at an ejection pitch of 50 μm with respect to the groove part between the banks of the olefin resin subjected to the $CF_4$ plasma processing. If the width W of the groove part was 5 μm, the ejected liquid droplet was not arranged in the groove part, but in cases of the width W of 10 μm and 25 μm, it was possible to arrange the liquid droplet in the groove part.

Electro-optical Apparatus

Figure 7:
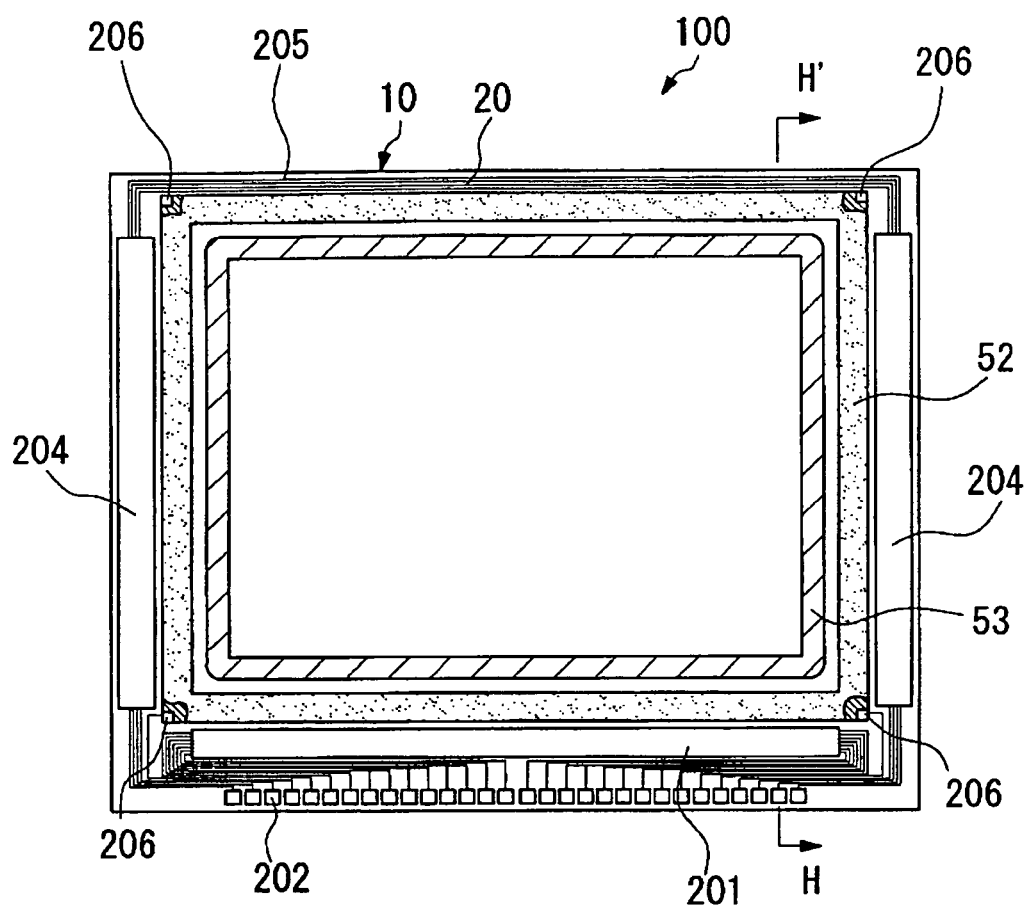
FIG. 7 is a plan view of a liquid crystal display viewed from an opposite substrate side.
Figure 8:
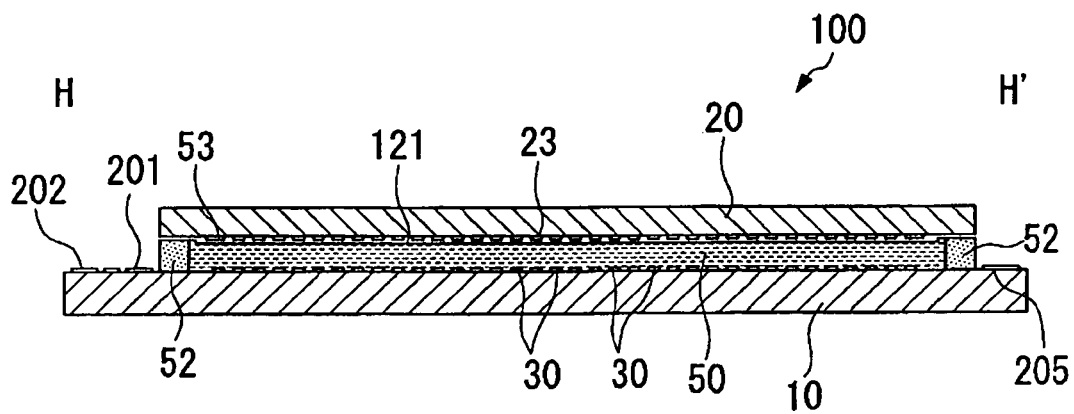
FIG. 8 is a sectional view along a line H-H' of FIG. 7.
Figure 9:
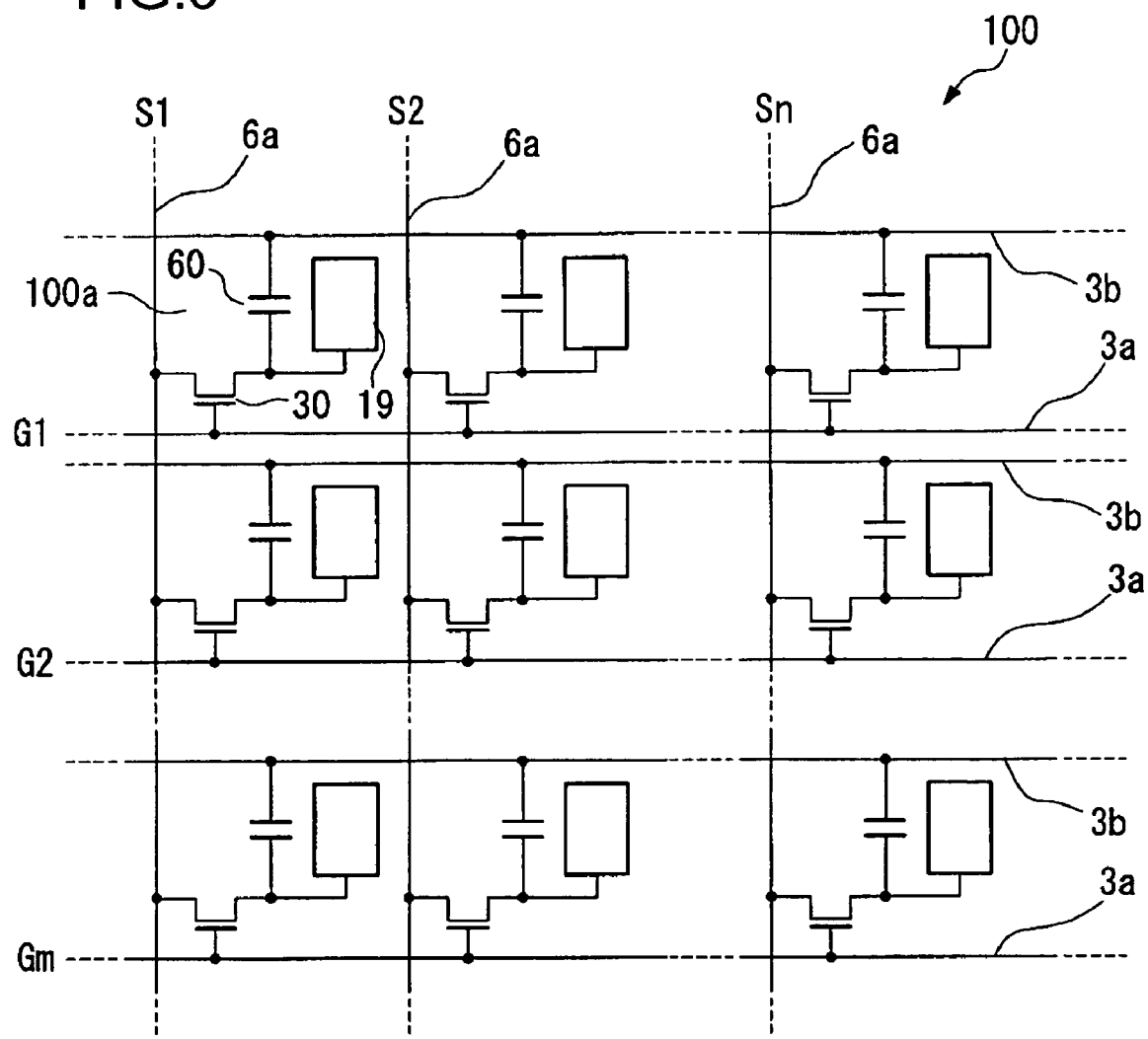
FIG. 9 is an equivalent circuit diagram of a liquid crystal display.
Figure 10:
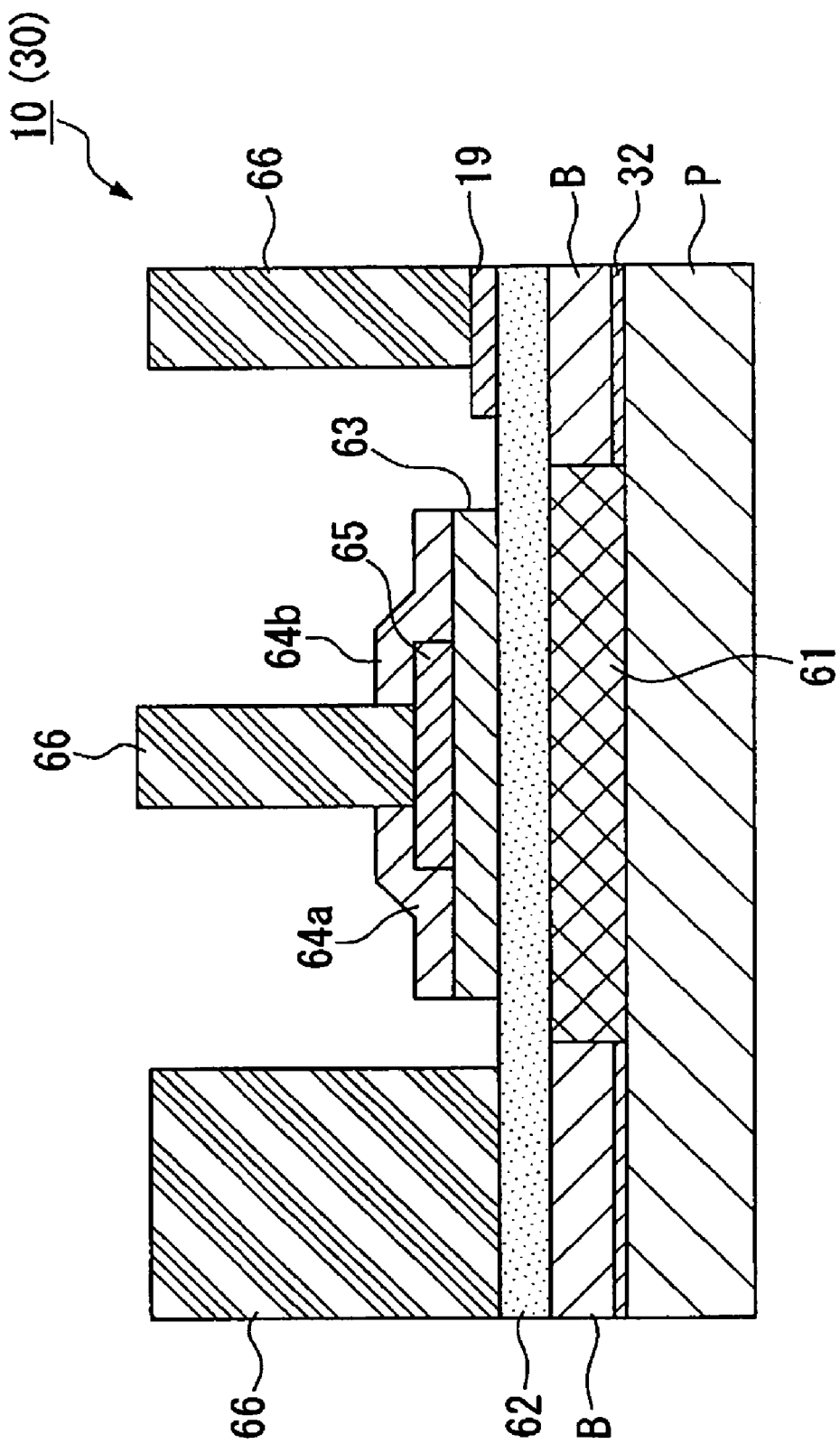
FIG. 10 is a partial enlarged sectional view of a liquid crystal display.

A liquid crystal display which is an example of an electro-optical apparatus of this invention will be described. FIG. 7 is a plan view of a liquid crystal display according to this invention as viewed from an opposite substrate side also showing each composing element, and FIG. 8 is a sectional view along a line H-H' of FIG. 7. FIG. 9 is an equivalent circuit diagram of various elements, wiring and the like in a plurality of pixels formed in matrix in the image display area of a liquid crystal display. FIG. 10 is a partial enlarged sectional view of a liquid crystal display. It is to be noted that in each drawing used for the following description, each layer and each member are drawn to a different scale, so that each layer and each member may be of size sufficiently large to enable recognition on the drawings.

In FIG. 7 and FIG. 8, a liquid crystal display (electro-optical apparatus) 100 according to this embodiment is constituted such that a pair of a TFT array substrate 10 and an opposite substrate 20 are bonded to each other by a sealant 52 which is a sealing material of an optical hardening type, the sealant 52 sealing and holding a liquid crystal 50 in an area partitioned by the sealant 52. The sealant 52 is formed in a shape of a closed frame in the area inside the substrate surface.

In a space inside the sealant 52-formed area, there is formed a fringing material 53 composed of a light shielding material. In an area outside the sealant 52, there are formed a data line drive circuit 201 and a mounted terminal 202 along one side of the TFT array substrate, and a scan line drive circuit 204 is formed along two sides adjacent to this side. At a remaining side of the TFT array substrate 10, there are formed a plurality of wiring 205 for connecting between the scan line drive circuits 204 provided on both sides of the image display area. Further, on at least one spot of corner parts of the opposite substrate 20, there is disposed a member for continuity between substrates 206 to provide electrical continuity between the TFT array substrate 10 and the opposite substrate 20.

Now, instead of forming the data line drive circuit 201 and the scan line drive circuit 204 on the TFT array substrate 10, for example, electrical and mechanical connections may be arranged between a TAB (Tape Automated Bonding) substrate mounted with a drive LSI and a group of terminals formed on the periphery of the TFT array substrate 10 through an anisotropic conductive film. Further, regarding the liquid crystal display 100, the type of liquid crystal 50 to be used, that is, depending on a difference of operating mode such as TN (Twisted Nematic) mode and STN (Super Twisted Nematic) mode, as well as normal white mode/normal black mode, a phase difference plate, a polarizing plate and the like are placed in a prescribed direction, but their illustrations are omitted. Furthermore, when constituting the liquid crystal display 100 for color display, on the opposite substrate 20, in an area facing each pixel electrode, to be mentioned later, of the TFT array substrate 10, there are formed, for example, a color filter of red (R) green (G), and blue (B), together with its protective film.

In the image display area of the liquid crystal display having such structure, as shown in FIG. 9, a plurality of pixels 100a are constituted in matrix, while a TFT (switching element) 3 for pixel switching is formed in each of these pixels 100a, and data wires 6a supplying pixel signals S1, S2, . . . , Sn are electrically connected to the TFT 30 sources. The pixel signals S1, S2, . . . , Sn to be written in the data wires 6a may be supplied in this sequence in order of wire, and, with respect to a plurality of mutually adjacent data wires 6a, may be supplied per group. Further, to TFT 30 gates, there are electrically connected scan lines 3a, and it is constructed such that at a prescribed timing, scan signals G1, G2, . . . , Gm are impressed in this sequence in order of wire on the scan lines 3a in terms of pulse.

Pixel electrodes 19 are electrically connected to drains of the TFT 30. By turning on the TFT 30, which are switching elements, for a fixed period of time, the pixel signals S1, S2, . . . , Sn supplied from the data lines 6a are written into each pixel at a prescribed timing. The pixel signals S1, S2, . . . , Sn written into liquid crystals through the pixel electrodes 19 are held for a fixed period of time between the pixel electrodes 19 and opposite electrodes 121 of the opposite substrate shown in FIG. 8. It is to be noted that to prevent the pixel signals S1, S2, . . . , Sn being held from leaking, a storage capacity 60 is added in parallel to a liquid crystal capacity formed in between the pixel electrodes 19 and the opposite electrodes 121. For example, a voltage of the pixel electrodes 19 is held by the storage capacity 60 for a period of time three digits longer than a period of time in which a source voltage was impressed. By this means, an electric charge holding property is improved, and it is possible to realize the liquid crystal display 100 having a high contrast ratio.

FIG. 10 is a partial enlarged sectional view of the liquid crystal display 100 having a bottom gate type TFT 30. On the glass substrate P constituting the TFT array substrate 10, there is formed gate wiring 61 between the banks B and B on the glass substrate P by means of the forming process of a wiring pattern of the above-mentioned embodiment.

On the gate wiring 61, there is deposited a semiconductor layer 63 consisting of an amorphous silicon (a-Si) layer through a gate insulating film 62 composed of SiNx. A portion of the semiconductor layer 63 consisting of the amorphous silicon layer (a-Si) facing this gate wiring portion is a channel area. On the semiconductor layer 63, there are deposited junction layers 64a and 64b comprised of, for example, an n+ type a-Si layer, to obtain ohmic junction, and on the semiconductor layer 63 in a central part of the channel area, there is formed an insulating etch-stop film 65 composed of SiNx to protect the channel. Further, these gate insulating film 62, semiconductor layer 63, and etch-stop film 65 are subjected to patterning as illustrated through undergoing photoresist coating, exposure and development, and photoetching, subsequent to vacuum evaporation.

Still further, the pixel electrodes 19 having the junction layers 64a and 64b and ITO are likewise subjected to film forming as well as photoetching thus to undergo patterning as illustrated. And the banks 66 are respectively set up protrudingly on the pixel electrodes 19, the gate insulating film 62 and the etch-stop film 65, whereas it is possible to form a source line and a drain line by ejecting liquid droplets of a silver compound among these banks 66 using the above-mentioned liquid droplet ejection unit IJ.

Moreover, in the above-mentioned embodiment, there was used a construction employing the TFT 30 as the switching elements to drive the liquid crystal display 100. However, in addition to the liquid crystal display, for example, it is applicable to an organic EL (electro-luminescence) display device. The organic EL display device is an element constituted by a thin film containing fluorescent inorganic and organic compounds which is grasped by anode and cathode: by injecting an electron and a hole into the thin film to cause recombination, an exciton is generated; and emission of light (fluorescence and phosphorescence) at the time of inactivation of the exciton is utilized to emit light. And of fluorescent materials used for the organic EL display element, materials exhibiting each light-emitting color of red, green, and blue, that is, light-emitting layer forming materials and a material forming a hole injection/electron transport layer are used as ink, and by patterning each on a substrate having the above-mentioned TFT, it is possible to manufacture a self light-emitting full color EL device. A range of a device (electro-optical apparatus) in this invention includes such organic EL device.

Figure 11:
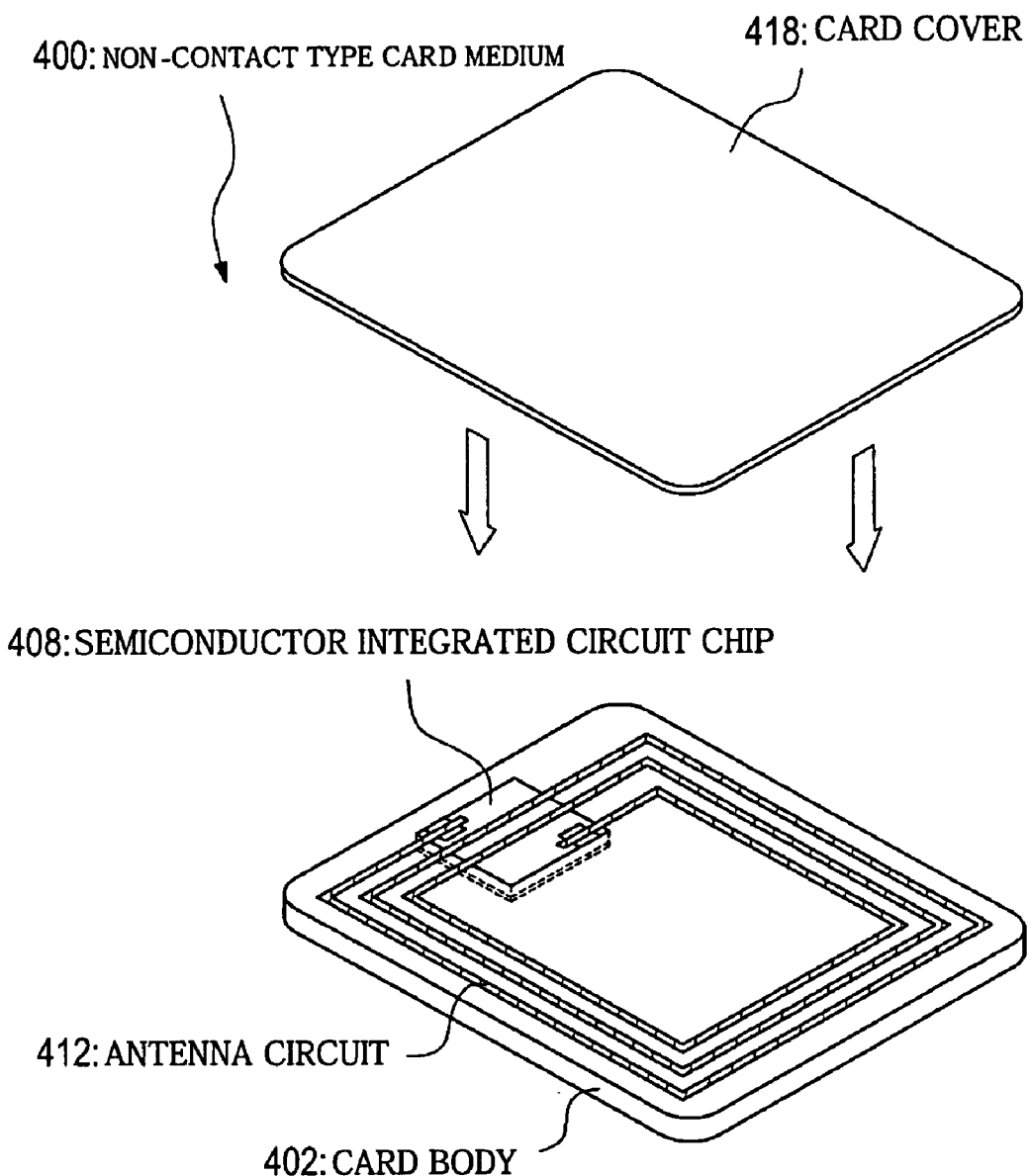
FIG. 11 is an exploded perspective view of a non-contact type card medium.

As another embodiment, an embodiment of a non-contact type card medium will be described. Referring to FIG. 11, a non-contact type card medium (electronic apparatus) 400 according to this embodiment has, in its frame composed of a card body 402 and a card cover 418, a built-in semiconductor integrated circuit chip 408 and a built-in antenna circuit 412, operating to perform at least one of power supply or data communication by means of at least one of an un-illustrated external transmitter/receiver and electromagnetic wave or electrostatic capacity combination. In this embodiment, the above-mentioned circuit 412 is formed by the forming process of a wiring pattern according to the above-mentioned embodiment.

Further, as devices (electro-optical apparatus) according to this invention, in addition to the above, this invention is also applicable to a PDP (plasma display panel) and an electron emission device of a surface conductive type and the like making use of a phenomenon which causes an emission of an electron by running a current in parallel to a film surface of a thin film of a small area formed on a substrate.

Electronic Apparatus

Specific examples of electronic apparatus of this invention will be described.

Figure 12A:
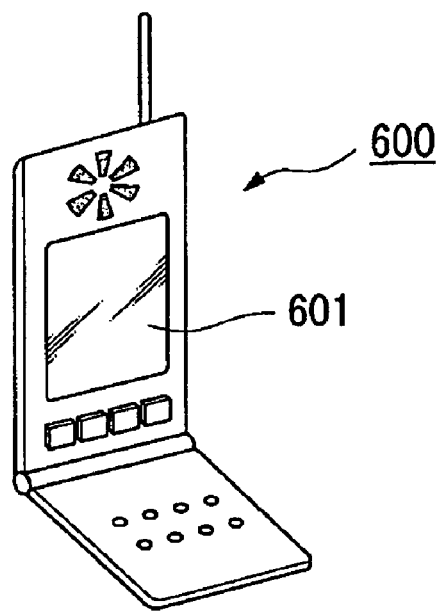
FIG. 12 is a diagram showing specific examples of electronic apparatus of this invention.

FIG. 12(a) is a perspective view of an example of a mobile phone. In FIG. 12(a), 600 shows a mobile phone body, while 601 shows a liquid crystal display part equipped with a liquid crystal display of the above-mentioned embodiment.

Figure 12B:
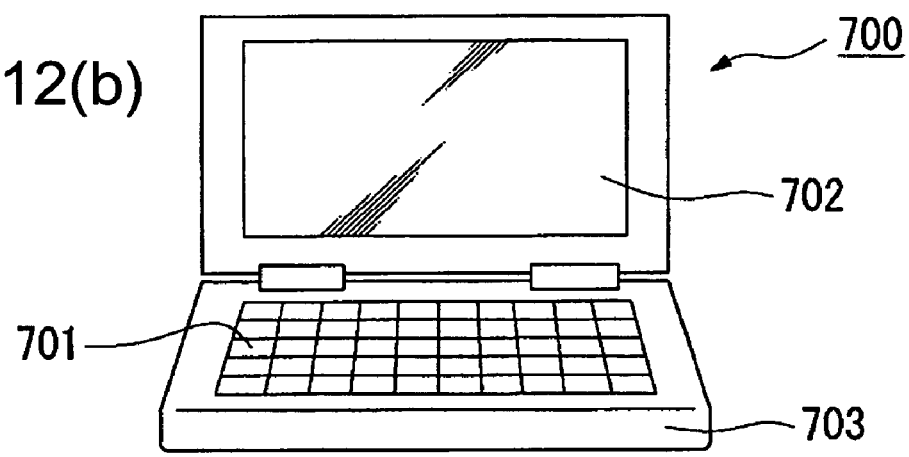

FIG. 12(b) is a perspective view showing an example of a mobile type information processing apparatus such as a word processor or a personal computer. In FIG. 12(b), 700 shows an information processing apparatus, 701 shows an input unit such as a keyboard, 703 shows an information processing body, and 702 shows a liquid crystal display part equipped with a liquid crystal display of the above-mentioned embodiment.

Figure 12C:
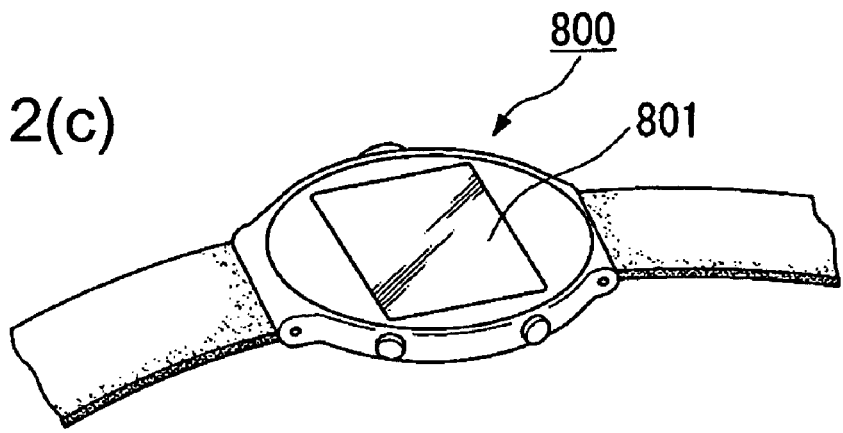

FIG. 12(c) is a perspective view showing an example of an electronic apparatus of a wrist watch type. In FIG. 12(c), 800 shows a watch body, and 801 shows a liquid crystal display part of a liquid crystal display of the above-mentioned embodiment.

The electronic apparatus shown in FIG. 12(a)-(c) are equipped with the liquid crystal displays of the above-mentioned embodiment, having a wiring pattern of properly formed thin lines.

Further, the electronic apparatus of this embodiment are those equipped with liquid crystal displays. However, these apparatus may be those equipped with other electronic-optical apparatus, such as an organic electroluminescence display and a plasma display.

Referring to the attached drawings, preferred embodiments according to this invention have been described. It goes without saying that this invention is not limited to these embodiments. A shape, a combination and the like of each composing element shown in the above-mentioned embodiments are but one example, and changes and variations may be made based on design requests and the like without departing from the spirit or scope of this invention.

For example, while the above-mentioned embodiments have been described with forming the banks and providing the banks with the liquid repellent property, it is to be understood that the invention is not limited thereto. For example, it is possible to form a desired wiring pattern by performing surface processing to the substrate such that lyophilic processing is provided to the planned area of wiring pattern formation while repellent liquefaction processing is applied to other sections, the ink and organosilver compounds containing conductive particulates being arranged on the part subjected to lyophilic processing.

Further, in the above-mentioned embodiments, the thin film pattern is constituted by a conductive film. However, it should be understood that this invention is not limited thereto. For example, it is applicable to a color filter used for making a displayed image on the liquid crystal display in color. It is possible to form this color filter by arranging ink (liquid material) of R (red), G (green), and B (black) as liquid droplets in a prescribed pattern. However, by forming banks matching a prescribed pattern, imparting the liquid repellent property to the banks, arranging the ink, and forming the color filter, it is possible to manufacture a liquid crystal display having a high-performance, color filter.

What is claimed is:

1. A forming process of a thin film pattern by placing a functional liquid on a substrate, comprising the steps of:
   processing surface treatment to form a closely adhered layer on the substrate;
   forming a bank to form banks matching the thin-film pattern on the substrate,
   wherein including a step of lyophilic processing to impart a lyophilic property to the bottom part between the banks,
   wherein the step of iyophilic processing includes processing ultraviolet irradiation, which removes the closely adhered layer;
   processing repellent liquefaction to impart a liquid repellent property to the banks; and
   arranging a material to place the functional liquid between the banks imparted with the liquid repellent property,
   wherein arranging the material includes ejecting a liquid droplet of the functional liquid between the banks with the banks having a width smaller than a diameter of the liquid droplet.

2. The forming process of a thin film pattern according to claim 1, wherein:
   the step of processing repellent liquefaction includes a step of processing plasma by using a fluorocarbon compound as a reaction gas.

3. The forming process of a thin film pattern according to claim 1, wherein: the liquid repellent property of the banks is provided higher than a bottom part between the banks.

4. The forming process of a thin film pattern according to claim 1, wherein:
   the functional liquid contains conductive particulates.

5. The forming process of a thin film pattern according to claim 1, wherein:

the functional liquid contains a material which manifests conductivity by heat treatment or optical processing.

6. A manufacturing process of a device having a step of forming a thin film pattern on a substrate, wherein:

the thin film pattern is formed on the substrate by the forming process of a thin film pattern according to claim 1.

7. The forming process of a thin film pattern according to claim 1, wherein:

the step of processing surface treatment includes coating a hexamethyldisilazane to the substrate.

8. The forming process of a thin film pattern according to claim 1, wherein: the step of lyophilic processing includes processing $O_2$ plasma which removes the closely adhered layer.

* * * * *